United States Patent [19]

Demmin et al.

[11] Patent Number: 5,049,976
[45] Date of Patent: Sep. 17, 1991

[54] STRESS REDUCTION PACKAGE AND PROCESS

[75] Inventors: Jeffrey C. Demmin, Palo Alto; Rajendra D. Pendse, Sunnyvale, both of Calif.

[73] Assignee: National Semiconductor Corporation, Santa Clara, Calif.

[21] Appl. No.: 295,595

[22] Filed: Jan. 10, 1989

[51] Int. Cl.⁵ .................................. H01L 23/48
[52] U.S. Cl. .................................. 357/71; 357/74
[58] Field of Search ............ 357/71, 74; 317/234 G

[56] References Cited

U.S. PATENT DOCUMENTS

| | | | |
|---|---|---|---|
| 3,284,176 | 11/1966 | Reed et al. | 29/195 |
| 3,588,632 | 7/1971 | Nakata | 317/234 G |
| 3,609,471 | 9/1971 | Scace et al. | 317/234 G |
| 3,646,409 | 2/1972 | Van de Water et al. | 317/234 G |
| 3,718,107 | 2/1973 | Bartels | 113/116 W |
| 3,733,525 | 5/1973 | Robinson et al. | 317/234 G |
| 3,740,619 | 6/1973 | Rosvold | 317/234 R |
| 3,823,772 | 7/1974 | Lavering | 165/81 |
| 3,896,479 | 7/1975 | Di Lorenzo | 357/71 |
| 4,204,628 | 5/1980 | Houston | 228/106 |
| 4,211,354 | 7/1980 | Hoffman et al. | 228/118 |
| 4,257,156 | 3/1981 | Houston | 29/580 |
| 4,281,941 | 8/1981 | Rottenkolber | 403/29 |
| 4,315,591 | 2/1982 | Houston | 228/188 |
| 4,320,412 | 3/1982 | Hynes et al. | 357/71 |
| 4,427,993 | 1/1984 | Fichot et al. | 357/81 |
| 4,445,271 | 5/1984 | Grabbe | 29/589 |
| 4,451,973 | 6/1984 | Tateno et al. | 29/588 |
| 4,572,757 | 2/1986 | Spadafora | 156/252 |
| 4,656,499 | 4/1987 | Butt | 357/71 R |

*Primary Examiner*—Eugene R. Laroche
*Assistant Examiner*—R. Ratliff
*Attorney, Agent, or Firm*—Flehr, Hohbach, Test, Albritton & Herbert

[57] ABSTRACT

An integrated circuit package (10) has a layer (22) of silicon positioned between copper die attach pad (18) and silicon integrated circuit die (12). The layer (22) should have a thickness of about half that of the silicon die (12). The layer (22) should also extend symmetrically beyond the die (12). Such an extension provides a horizontal surface beyond the die (12) to which thermosetting encapsulating resin (20) will adhere to produce an enhanced stress reduction effect. Vertical edges (23) of the layer (22) also help to prevent stress of the die (12) by resisting force from the encapsulating resin (20) after it shrinks during curing.

10 Claims, 1 Drawing Sheet

5,049,976

STRESS REDUCTION PACKAGE AND PROCESS

BACKGROUND OF THE INVENTION

1. Field of the Invention:

The present invention relates generally to a structure and process which reduces mechanical stresses imparted to a semiconductor die due to coefficient of expansion mismatch when a plastic encapsulated package fabricated at an elevated temperature is cooled down to room temperature. More particularly, it relates to such a structure and process which reduces the mechanical stresses imparted to the semiconductor die by the plastic encapsulating material.

2. Description of the Prior Art:

It is known in a variety of applications to reduce mechanical stresses between dissimilar materials bonded together at elevated temperatures and then cooled to room temperature by interposing a stress reduction layer of a third material, matching the coefficient of thermal expansion of one of the materials, between the dissimilar materials. In particular, U.S. Pat. No. 4,320,412, issued Mar. 16, 1982 to Hynes et al. discloses the use of an iron-nickel-cobalt Kovar alloy as an intermediate layer between a silicon power transistor die and a copper lead frame including a receptacle for the silicon die for overcoming coefficient of expansion mismatch between the power transistor die and the lead frame. In that environment, the difference in expansion of the copper compared with the silicon may cause sufficient stress during thermal cycling to break the power transistor die.

While such an intermediate layer will overcome the coefficient of expansion mismatch between the silicon and the copper, an even more significant source of mechanical stress on a plastic encapsulated semiconductor integrated circuit die as conventionally packaged arises from shrinkage and contraction of the epoxy or other plastic encapsulating material when it is cured at an elevated temperature and cooled to room temperature. In fact, as discussed more fully below, the mechanical stresses on the semiconductor integrated circuit die which arise from this source are large enough both to cancel out the mechanical stresses arising from the coefficient of expansion difference between silicon and copper and to induce a larger mechanical stress opposite to that induced by the expansion differences of the silicon and copper. Experience with ceramic packages, in which no plastic encapsulating material is used, show that the mechanical stresses induced by the coefficient of expansion difference between a copper bonding pad and a semiconductor integrated circuit die are low enough that most typical integrated circuits require no intermediate layer or other structure to reduce these stresses in ceramic packages. However, in the case of plastic encapsulated integrated circuit packages, the larger mechanical stresses arising from the interaction of the encapsulating material and the integrated circuit die result in a significant number of packaged integrated circuits that fail to meet performance specifications.

SUMMARY OF THE INVENTION

Accordingly, it is an object of this invention to provide a package and process for reducing mechanical stresses imparted to a semiconductor integrated circuit die by shrinkage and contraction of an encapsulating plastic material.

It is another object of the invention to provide such a package and process which will produce a greater reduction in mechanical stress than is obtainable by compensating for a difference in coefficient of expansion between the semiconductor integrated circuit die and a supporting substrate, such as a die attach pad.

It is a further object of the invention to provide such a package and process in which the production of plastic encapsulated integrated circuits failing performance specifications is substantially reduced.

The attainment of these and related objects may be achieved through use of the novel stress reduction package and process herein disclosed. A stress reduction package in accordance with this invention has a die attach pad and a stress reduction pad attached to the die attach pad. The stress reduction pad has a coefficient of thermal expansion equal to or approximately matching the coefficient of thermal expansion of silicon. A silicon integrated circuit die is attached to a surface of the stress reduction pad facing away from the die attach pad. In one aspect of the invention, the surface has a portion extending beyond each side of the integrated circuit die. An encapsulating body of thermosetting resin encapsulates the die attach pad, the stress reduction pad and the integrated circuit die. The thermosetting resin adheres to the surface portion to produce an enhanced stress reduction. In another aspect of the invention, the stress reduction pad has vertical edges proximate to vertical edges of the integrated circuit die. These vertical edges of the stress reduction pad resist forces applied by the thermosetting resin to the vertical edges of the stress reduction pad and the vertical edges of the integrated circuit die.

The attainment of the foregoing and related objects, advantages and features of the invention should be more readily apparent to those skilled in the art, after review of the following more detailed description of the invention, taken together with the drawings, in which:

DETAILED DESCRIPTION OF THE INVENTION

Figure 1:
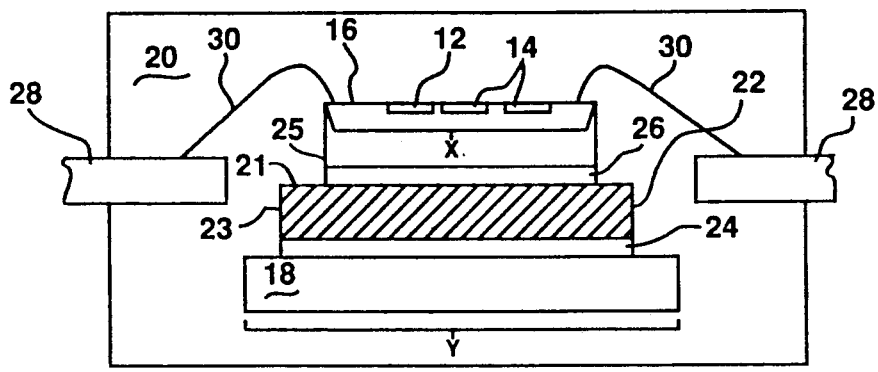
FIG. 1 is a somewhat schematic cross section (not to scale) of a stress reduction package in accordance with the invention.

Turning now to the drawings, more particularly to FIG. 1, there is shown a cross section view of an integrated circuit package 10 in accordance with the invention. The package 10 includes an integrated circuit die 12 having a plurality of diffused resistors indicated schematically at 14 in its upper surface 16. The die 12 has other circuit components, such as transistors and diodes (not shown), formed in its upper surface 16. Mechanical stress on the semiconductor die 12 will shift the resistance of the diffused resistors 14. Such resistance shifts cause problems in certain integrated circuits, such as precision linear integrated circuits, especially if the shifts are different for different diffused resistors 14, because such resistance shifts alter the performance characteristics of the integrated circuits. In a conventional package, the semiconductor die 12 would be attached directly, such as with a conductive polyimide based adhesive, to a copper die attach pad 18. In such a conventional package, substantial mechanical stress of the silicon die 12 and resistance shift of the resistors 14 occurs, both due to coefficient of thermal expansion mismatch between the silicon die 12 and the die attach pad and shrinkage/contraction of encapsulating epoxy resin 20. For those integrated circuits in which the resistance shift represents a problem, it is conventional practice to package the integrated circuit die in ceramic packages in order to eliminate the largest mechanical stresses on the die, which result from the epoxy resin, not used in ceramic packages.

In accordance with this invention, in the package 10, a layer 22 of silicon or other material closely matching the thermal expansion coefficient of the silicon of the die 12, such as ceramic, is positioned between the copper die attach pad 18 and the silicon die. Copper has a relatively high coefficient of thermal expansion, about $16.6 \times 10^{-6}$ cm/cm/° C. Silicon has a much lower coefficient of thermal expansion, about $3.0 \times 10^{-6}$ cm/cm/° C. In addition to matching the thermal expansion coefficient of the silicon die 12 closely, if a material other than silicon is chosen for the layer 22, it should be a material to which the epoxy encapsulating resin 20 will adhere. The layer 22 should have a thickness of about half that of the silicon die 12. Since die 12 typically has a thickness of about 17 thousandths of an inch (mils), a thickness of about 8 mils for the layer 22 is appropriate. The layer 22 should also extend symmetrically beyond the die 12 as shown. For example, if the silicon die has a width of x and the die attach pad 18 has a width of y, the layer 22 should have a width of $(x + y)/2$. As is shown in FIG. 2B, it is not necessary that the layer 22 extend beyond the die 12 the same amount on all sides. The die 12 should be placed on the layer 22 so that the layer 22 extends beyond the die 12 the same amount on either side on the x axis and the same amount on either side on the y axis, but the x axis amount and the y axis amount can be different. Such an extension is necessary to provide a horizontal surface 21 beyond the die 12 to which the encapsulating resin 20 can adhere. Vertical edges 23 of the layer 22 also help to prevent stress of the die 12 by resisting force from the encapsulating resin 20 after it shrinks during curing. Such resistance against the resin as it shrinks reduces the amount of force also applied by the shrinking resin against vertical edges 25 of the die 12. In order for the vertical edges 23 of the layer 22 to be effective for this purpose, they should be proximate to the vertical edges 25 of the die 12. In other words, the layer 12 should not extend beyond the die to such a great extent that the stress relief benefit of the vertical edges 23 is lost. In order to benefit both from the presence of the horizontal surface 21 extending beyond the die 12 and the vertical edges 25 proximate to the die 12, the layer 22 should extend beyond the die 12 in accordance with the above relationship defining the horizontal surface. That relationship allows an appropriate balancing between the adherence of the resin to the horizontal surface 21 and the resisting force of the vertical edges 23.

It is preferred to use silicon as the layer 22, since it can be applied using the same processes and equipment used to attach the die 12 to the die attach pad 18. In practice, both the silicon layer 22 and the silicon die 12 are attached to the die attach pad 18 using a conductive polyimide resin composition in layers 24 and 26. If a ceramic material is used for the layer 22, it can be applied by a vacuum evaporation or sputtering process. To complete the package, interconnection leads 28 are connected to the die 12 by wire bonds 30 in a conventional manner prior to encapsulation.

The following examples explain the invention further and represent best modes for practice of the invention.

Example I

Figure 2A:
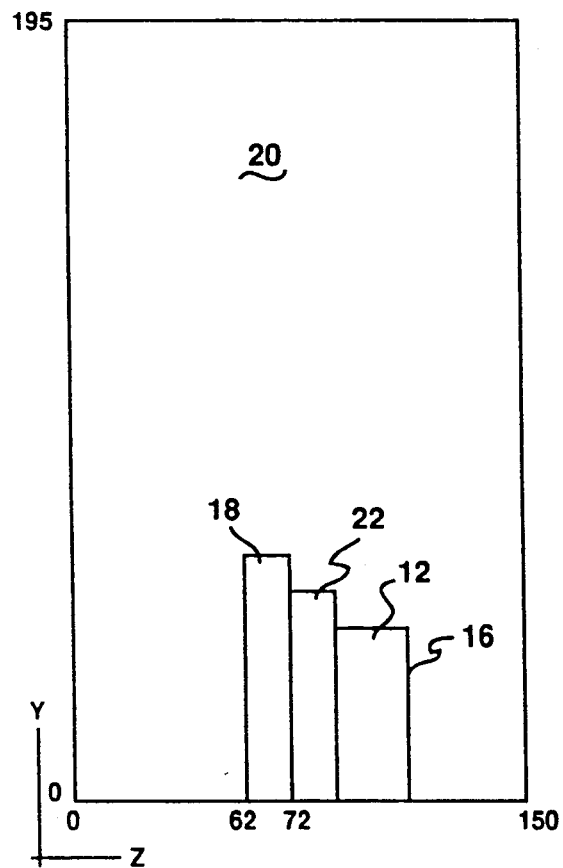
FIGS. 2A and 2B are cross section and plan finite element analysis diagrams of a portion of the package shown in FIG. 1.
Figure 2B:
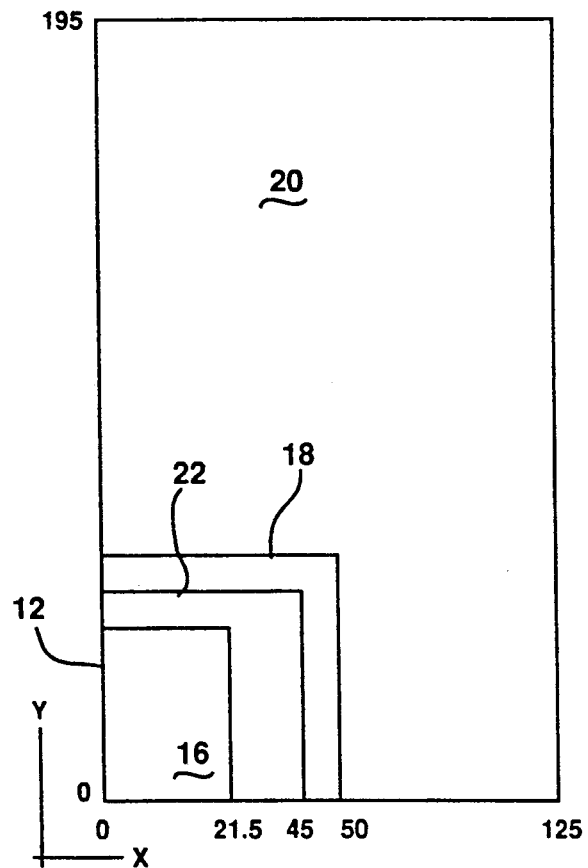

FIGS. 2A and 2B show a representative die attach pad 18, silicon stress relief layer 22 and silicon die 12 structure, encapsulated in a conventional thermosetting epoxy encapsulating resin 20, commercially available from Plaskon, as used for finite element analysis. The control is with the silicon die 12 directly attached to the die attach pad. Theoretical stress was calculated using a commercially available ANSYS Finite Element Analysis Program for the control, for a plastic encapsulated package including an 8 mil Si stress reduction pad, and for a plastic encapsulated package including an 11 mil ceramic stress reduction pad. Calculation of theoretical stress at die surface 16 gave the results shown below in Table I. No further work was done with the ceramic stress reduction pad, since a suitable process for producing packages including it in production quantities is not presently available.

TABLE I

| Leg | Theoretical Stress (kpsi) | |
|---|---|---|
| | $\sigma_x$ | $\sigma_y$ |
| control | 25.0 | 35.3 |
| 8 mil Si pad | 17.8 | 26.8 |
| 11 mil ceramic pad | 15.6 | 23.9 |

Piezoresistance test silicon die having dimensions of 121 × 122 mils and having implanted resistors as stress sensors were directly attached to copper die bonding pads using conductive polyimide adhesive and with an 8 mil thick silicon stress reduction intermediate layer, both the die and the silicon stress reduction layer being attached with the conductive polyimide adhesive in the same manner as the direct die attach samples. The samples were then encapsulated by molding thermosetting epoxy resin obtained from Plaskon around the attached die and bonding pads at a temperature of 175° C. Resistance shift of the implanted resistors was measured at room temperature after die attach and after epoxy molding, using a Hewlett Packard system consisting of an HP4141B DC current source and a HP3852A Data Acquisition Unit. A sample size of 50 units of each type was employed. The results are shown below in Table II.

TABLE II

| | Average Resistance Shift, % | |
|---|---|---|
| Sample | After Die Attach | After Mold |
| Control | +2.90 | −5.93 |
| Si Stress Reduction Layer | +1.44 | −3.37 |

In general, resistance shifts between about 3 and 4 percent begin to produce an increase in parts failing to meet product specifications. The results after die attach and before molding are consistent with the experience using ceramic packages for commercial production. With such packages, yield loss due to die shift is not observed. However, plastic encapsulated integrated circuits fabricated with no stress reduction layer (corresponding to the Control in Table II) have a yield loss of about 35% for failure to meet performance specifications due to die stress, although the circuits met performance specifications when tested at the wafer level. Corresponding plastic encapsulated integrated circuits fabricated with the stress reduction layer as above have a yield loss of only about 7% for failure to meet performance specifications due to die stress.

Measured as a reduction in the resistance shift after molding, an improvement of 43% was obtained by using the stress reduction layer. A reduction of between about 24% and 29% in theoretical stress was predicted by finite element analysis.

Example II

Comparative production runs of LF356 BI-FET operational amplifier integrated circuits were packaged with plastic encapsulation with no stress reduction pad and with an 8 mil thick silicon stress reduction pad between the integrated circuit die and its copper bonding pad in the same manner as the parts in Example I. A quantity of 1000 parts each without the stress reduction pad and with the stress reduction pad was fabricated. Measurement of parametric shift in the form of change in offset voltage $V_{os}$ was carried out, giving the results shown below in Table III as the value of the mean plus $2\sigma$ in volts.

TABLE III

| No pad | Si stress relief pad | Improvement |
|---|---|---|
| 5.661 v | 4.230 v | 25% |

The change in offset voltage is a measure of the difference in matched resistance in the integrated circuits as measured prior to packaging and after packaging. This change is related to die stress. The lower value with the silicon stress relief pad indicates a substantial reduction in stress, but the stress reduction is not in the same proportion as the reduction in offset voltage change. Reducing change in offset voltage results in a reduction of yield losses due to failure to meet performance specifications after packaging.

It should now be apparent to those skilled in the art that a novel stress reduction package and process capable of achieving the stated objects of the invention has been provided. The package and process significantly reduces stress produced by shrinkage and contraction of an encapsulating plastic material. The stress reduction is substantially greater than predicted on the basis of differences in thermal expansion coefficient of the silicon die and the copper die bonding pads. The package and process reduces the proportion of plastic encapsulated integrated circuits produced which fail to meet performance specifications.

It should further be apparent to those skilled in the art that various changes in form and details of the invention as shown and described may be made. It is intended that such changes be included within the spirit and scope of the claims appended hereto.

What is claimed is:

1. An integrated circuit package, which comprises a die attach pad, a stress reduction pad attached to said die attach pad, said stress reduction pad having a coefficient of thermal expansion equal to or approximately matching the coefficient of thermal expansion of silicon, a silicon integrated circuit die attached to a surface of said stress reduction pad facing away from said metal die attach pad, the surface having a portion extending beyond each side of said integrated circuit die, and an encapsulating body of thermosetting resin around said die attach pad, said stress reduction pad and said integrated circuit die, said thermosetting resin adhering to the surface portion to produce an enhanced stress reduction, said stress reduction pad having vertical edges extending above said die attach pad proximate to vertical edges of the integrated circuit die, said vertical edges of said stress reduction pad resisting forces applied by said thermosetting resin to said vertical edges of the stress reduction pad and to said integrated circuit die to reduce stress applied by said thermosetting resin to said integrated circuit die, said integrated circuit die being symmetrically placed on said stress reduction pad and said stress reduction pad having a width of about $(x+y)/2$, where x is a width of said integrated circuit die and y is a width of said die attach pad.

2. The integrated circuit package of claim 1 in which said stress reduction pad is a silicon pad.

3. The integrated circuit package of claim 1 in which said thermosetting resin is an epoxy resin.

4. The integrated circuit package of claim 1 in which said die attach pad is a copper pad.

5. The integrated circuit package of claim 1 in which said die attach pad is a copper pad and said stress reduction pad is a silicon pad.

6. The integrated circuit package of claim 5 in which said stress reduction pad is attached to said die attach pad by a first layer of conductive polyimide resin between said die attach pad and said stress reduction pad.

7. The integrated circuit package of claim 8 in which said silicon integrated circuit is attached to said stress reduction pad by a second layer of conductive polyimide resin between said stress reduction pad and said silicon integrated circuit.

8. The integrated circuit package of claim in which said stress reduction pad has a thickness of about half of a thickness of said integrated circuit die.

9. The integrated circuit package of claim 1 in which said stress reduction pad has vertical edges proximate to vertical edges of the integrated circuit die, said vertical edges of the stress reduction pad resisting forces applied by the thermosetting resin to said vertical edges of the stress reduction pad and to said integrated circuit die to reduce stress applied by the thermosetting resin to said integrated circuit die.

10. The integrated circuit package of claim 1 in which said integrated circuit die contains a plurality of resistors.

* * * * *